United States Patent
Darabi

(10) Patent No.: US 8,674,771 B2
(45) Date of Patent: Mar. 18, 2014

(54) FIXED BANDWIDTH LO-GEN

(75) Inventor: Hooman Darabi, Laguna Niguel, CA (US)

(73) Assignee: Broadcom Corporation, Irvine, CA (US)

(*) Notice: Subject to any disclaimer, the term of this patent is extended or adjusted under 35 U.S.C. 154(b) by 206 days.

(21) Appl. No.: 12/765,754

(22) Filed: Apr. 22, 2010

(65) Prior Publication Data

US 2010/0203848 A1    Aug. 12, 2010

Related U.S. Application Data

(63) Continuation-in-part of application No. 12/021,368, filed on Jan. 29, 2008, now abandoned.

(51) Int. Cl.
*H03L 7/00* (2006.01)

(52) U.S. Cl.
USPC .......... 331/16; 331/34; 331/44; 331/179; 327/156; 455/86

(58) Field of Classification Search
USPC ............ 331/16, 34, 44, 179; 327/156; 455/86
See application file for complete search history.

(56) References Cited

U.S. PATENT DOCUMENTS

| | | | |
|---|---|---|---|
| 7,103,337 B2* | 9/2006 | Uozumi et al. | 455/255 |
| 7,142,062 B2* | 11/2006 | Vaananen et al. | 331/11 |
| 7,492,228 B2* | 2/2009 | Strange | 331/16 |
| 7,772,934 B2* | 8/2010 | Vancorenland et al. | 331/179 |
| 2006/0160492 A1* | 7/2006 | Jensen | 455/76 |
| 2007/0247235 A1* | 10/2007 | Gatta | 331/16 |
| 2008/0079500 A1* | 4/2008 | Rofougaran | 331/16 |
| 2008/0278249 A1* | 11/2008 | Hyvonen | 331/117 R |

* cited by examiner

*Primary Examiner* — Arnold Kinkead
*Assistant Examiner* — Richard Tan
(74) *Attorney, Agent, or Firm* — Garlick & Markison; Holly L. Rudnick

(57) ABSTRACT

A local oscillation generator (LO-GEN) maintains a fixed bandwidth using a voltage controlled oscillator (VCO) calibration module and gain calibration module that together compensate for variations in the VCO gain based on the oscillation frequency. During an open loop calibration of the LO-GEN, the VCO calibration module programs the VCO gain to an initial coarse value based on the oscillation frequency and then the gain calibration module adjusts the charge pump current to compensate for VCO gain changes.

21 Claims, 9 Drawing Sheets

FIXED BANDWIDTH LO-GEN

CROSS-REFERENCE TO RELATED APPLICATIONS

The present U.S. Utility patent application claims priority pursuant to 35 U.S.C. §120, as a continuation-in-part (CIP), to the following U.S. Utility patent application which is hereby incorporated herein by reference in its entirety and made part of the present U.S. Utility patent application for all purposes:
1. U.S. Utility application Ser. No. 12/021,368, entitled "Fixed Bandwidth LO-GEN," filed Jan. 29, 2008, pending.

BACKGROUND

1. Technical Field

The present invention relates to wireless communications and, more particularly, to local oscillation generators within wireless transceivers.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out of band signals to produce a filtered signal. The data recovery stage demodulates the filtered signal to recover the raw data in accordance with the particular wireless communication standard.

As is also known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

In a typical conventional RF transceiver architecture, the local oscillations mixed with the transmitter or receiver IF or baseband signals are produced by a local oscillation generator (LO-GEN). One common type of LO-GEN is designed around a phase-locked loop (PLL) frequency synthesizer including a voltage controlled oscillator (VCO) that provides a generated RF frequency signal as the local oscillation signal to be mixed with the transmitter or receiver IF or baseband signals. However, as the oscillation frequency of the VCO changes, the VCO gain may also change, which can undesirably result in a varying loop bandwidth.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
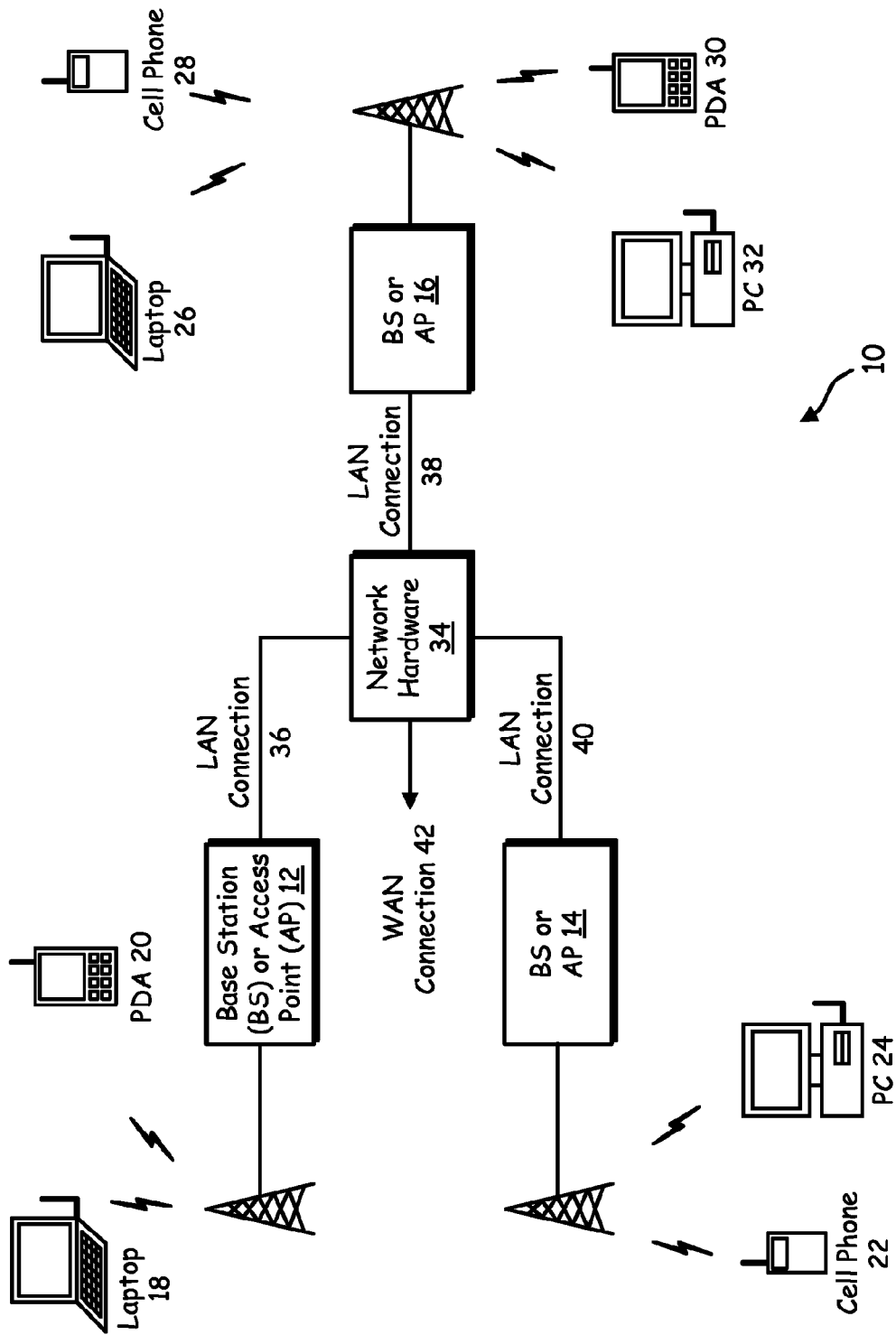
FIG. 1 is a functional block diagram illustrating a communication system that includes a plurality of base stations or access points (APs), a plurality of wireless communication devices and a network hardware component.

FIG. 1 is a functional block diagram illustrating a communication system 10 that includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-5.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. For example, access points are typically used in Bluetooth systems. Regardless of the particular type of communication system, each wireless communication device and each of the base stations or access points includes a built-in radio and/or is coupled to a radio. The radio includes a transceiver (transmitter and receiver) for modulating/demodulating information (data or speech) bits into a format that comports with the type of communication system.

Figure 2:
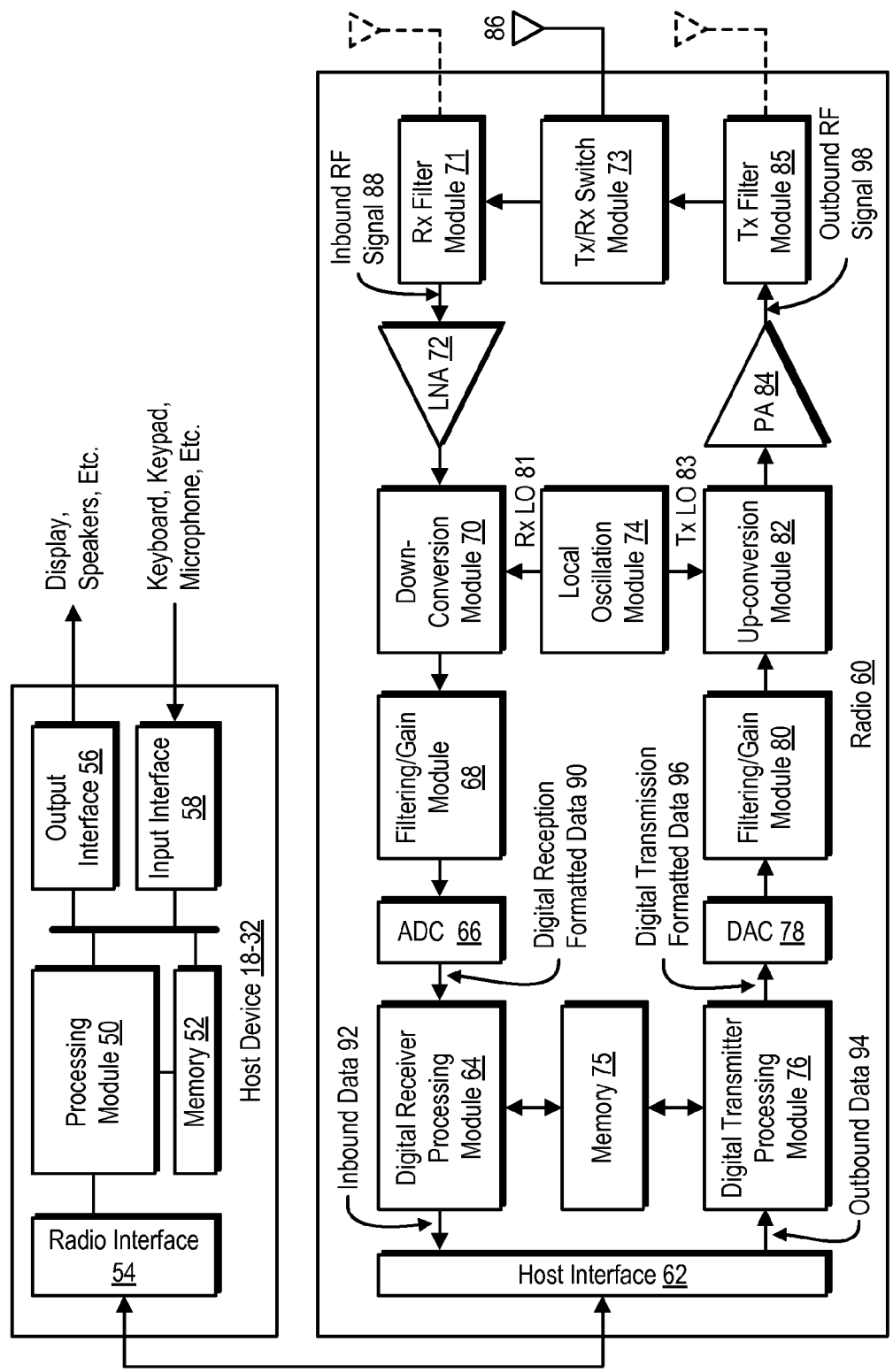
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, receiver filter module 71, a transmitter/receiver (Tx/RX) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. However, it should be understood that in other embodiments, the antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, modulation. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. The power amplifier 84 amplifies the RF signal to produce an outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. The down-conversion module 70 provides the inbound low IF signal or baseband signal to the filtering/gain module 68.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 2 is one that may be implemented to include either a direct conversion from RF to baseband and baseband to RF or for a conversion by way of a low intermediate frequency. In either implementation, however, for an up-conversion module 82 and a down-conversion module 70, it is required to provide accurate frequency conversion. For the down-conversion module 70 and up-conversion module 82 to accurately mix a signal, however, it is important that the local oscillation module 74 provide an accurate local oscillation signal for mixing with the baseband/IF or RF by the up-conversion module 82 and down-conversion module 70, respectively. Accordingly, in accordance with embodiments of the present invention, the local oscillation module 74 includes circuitry for adjusting an output frequency of a local oscillation signal provided therefrom, as will be described in more detail below.

Figure 3A:
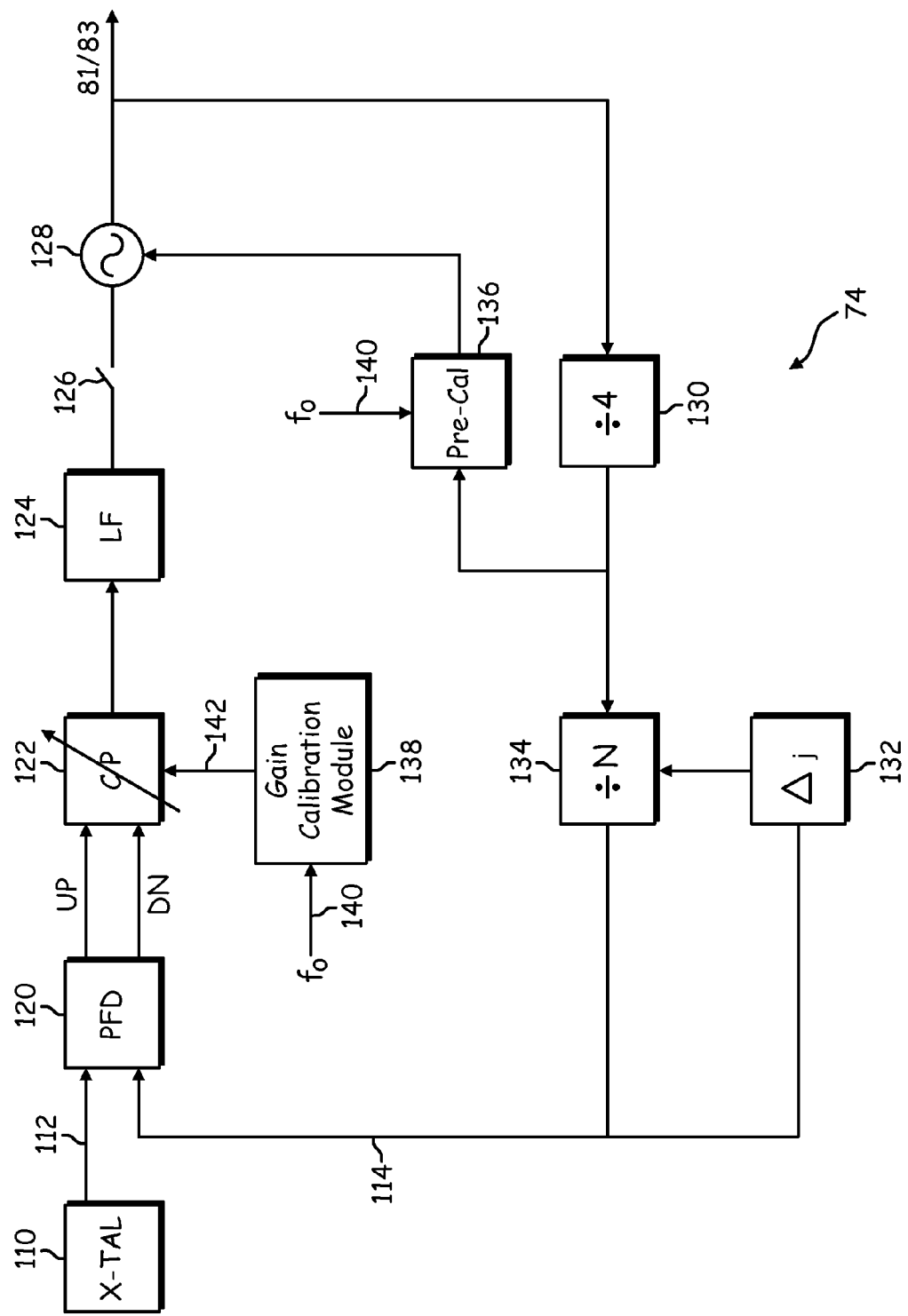
FIGS. 3A and 3B are schematic block diagrams illustrating exemplary fixed bandwidth LO-GENs for use in a wireless communication device, in accordance with embodiments of the present invention.

FIG. 3A is a schematic block diagram of an exemplary local oscillation module 74, in accordance with embodiments of the present invention. The local oscillation module 74 shown in FIG. 3 is a PLL frequency synthesizer, which is also referred to herein as a "LO-GEN." The LO-GEN 74 includes a precise crystal oscillator (X-TAL) 110, a phase and frequency detector (PFD) 120, a charge pump (CP) 122, a low-pass loop filter (LPF) 124, a voltage controlled oscillator (VCO) 128 and a frequency divider in the feedback path, represented by blocks 130, 132 and 134. Each frequency divider block in the feedback path divides the feedback signal by some integer. For example, the divide-by-four divider block 130 in the feedback path divides the feedback signal by four, while the multi-modulus divide-by-N divider, represented by blocks 132 and 134, in the feedback path divides the feedback signal by a programmable integer N.

A qualitative description of the operation of the LO-GEN 74 is as follows. The reference generator (X-TAL) 110 generates a reference signal 112 that is provided to the reference input of the PFD 120. The output of the PFD 120 is an error signal (in phase and/or frequency) between the filtered reference analog signal 112 and a feedback signal 114. The charge pump 122 responds to the (UP,DN) control signals of the PFD 120 by either "pumping" current into the loop filter 124 or moving current out of the loop filter 124 and "pumping" it into ground. The current pulses of the CP 122 are filtered by the loop filter 124 thereby generating a smooth output voltage referred to as the "control voltage", $v_{ctrl}$.

The oscillation frequency of the VCO 128 of the LO-GEN 74 is determined by the control voltage, $v_{CTRL}$, supplied by the loop filter 124. The VCO 128 oscillation is output as the local oscillation signal 81/83 produced by the LO-GEN 74. In addition, the output of the VCO 128 is input to the frequency divider blocks 130, 132 and 134 to produce the feedback signal 114 input to the PFD 120.

The sensitivity of the VCO 130 to changes in the control voltage is referred to as the VCO gain. This sensitivity is dependent upon the oscillation frequency of the VCO. Thus, as the VCO oscillation frequency changes, the sensitivity of the VCO (i.e., the VCO gain) also changes. Since the loop bandwidth of the PLL (LO-GEN) 74 is a function of the CP 122 current, the VCO gain and the resistance of the LF 124, any changes to the VCO gain can cause undesirable changes in the loop bandwidth. The following equations illustrate this concept, where $k_{VCO}$ is the VCO gain, R is the resistance of the loop filter 124, N is the value of the programmable frequency divider, $I_{CP}$ is the charge pump current, $f_0$ is the oscillation frequency of the VCO, $f_{XTL}$ is the reference frequency and BW is the loop bandwidth. Generally, the VCO gain varies as a function of the cube of the oscillation frequency, such that:

$$k_{VCO} \cong f_0^3. \quad \text{(Equation 1)}$$

With the loop bandwidth (BW) represented as:

$$BW \approx \frac{k_{VCO} * I_{CP} * R}{N}, \quad \text{(Equation 2)}$$

and the value of the frequency divider (N) represented as:

$$N = \frac{f_0}{f_{XTL}},\quad\text{(Equation 3)}$$

the relationship between the loop bandwidth (BW) and the oscillation frequency can be represented as:

$$BW \approx I_{CP} * k * f_0^2. \quad\text{(Equation 4)}$$

Thus, as can be seen from the above-equations, the loop bandwidth (BW) varies proportionally to the square of the oscillation frequency ($f_0$). It follows that in order to maintain a constant loop bandwidth, the charge pump current should be changed proportionally to the inverse of the square of the oscillation frequency.

Therefore, in accordance with embodiments of the present invention, whenever the oscillation frequency of the VCO changes, the LO-GEN 74 undergoes an open loop "calibration" to not only lock-on to the new oscillation frequency of the VCO 128, but also to compensate for variations in the VCO gain, thereby maintaining a constant, fixed loop bandwidth. As such, the LO-GEN 74 further includes switch 126, pre-calibration module 136 and gain calibration module 138.

During the open loop calibration, the switch 126 remains in the "OFF" or open state, thus preventing the output from the LF 124 from controlling the VCO 128. Instead, the pre-calibration module 136 controls the VCO 128 and enables the VCO 128 output to "lock" to the desired new oscillation frequency ($f_0$) 140. At the same time, the gain calibration module 138 generates a control signal 142 based on the desired new oscillation frequency ($f_0$) 140 that operates to adjust the charge pump current ($I_{CP}$) inversely proportional to the square of the desired new oscillation frequency ($f_0$) 140. Once the pre-calibration module 138 locks the VCO 128 onto the desired new oscillation frequency and the gain calibration module 138 programs the charge pump (CP) to compensate for variations in the VCO gain resulting from the change to the new oscillation frequency, the switch 126 closes to enable the control voltage output from the LP 124 to once again control the VCO 128.

In one embodiment, the gain calibration module 138 operates in real-time to calculate the desired charge pump current and generate the control signal 142 to program the CP 122 accordingly. In another embodiment, the gain calibration module 138 maintains a look-up table of oscillation frequencies and control signals to determine the correct control signal 142 to be applied to the CP 122 for the desired new oscillation frequency.

In either embodiment, in an exemplary operation, to determine the appropriate charge pump current for a particular oscillation frequency, the gain calibration module 138 first determines the initial VCO gain ($k_{VCO}$) for the center frequency ($f_c$) across a bandwidth of interest (e.g., the desired bandwidth of the LO-GEN). Based on the VCO gain for the center frequency, and using Equation 2 above, the gain calibration module 138 sets or adjusts the charge pump current ($I_{CP}$) to an initial value such that the resulting loop bandwidth of the LO-GEN 74 is equal to the desired bandwidth (BW) of the LO-GEN 74. Once these initial values have been determined, the gain calibration module 138 stores the initial $k_{VCO}$ and the initial $I_{CP}$ for the center frequency for subsequent use in either real-time calculations of the control signal 142 or off-line calculations to populate the look-up table.

In particular, to calculate the charge pump current needed to compensate for variations in $k_{VCO}$ due to a change in oscillation frequency $f_0$, the gain calibration module 138 calculates the difference between the center frequency $f_c$ and the new oscillation frequency $f_0$ and then calculates the needed adjustment in charge pump current, denoted $I_{CP}$(change), as:

$$I_{CP}(\text{change})=1/(f_c-f_0)^2. \quad\text{(Equation 5)}$$

Thereafter, the gain calibration module 138 determines the appropriate control signal 142 to be applied to the programmable CP 122 to set the new charge pump current $I_{CP}$(NEW) such that:

$$I_{CP}(\text{NEW})=I_{CP}(\text{initial})-I_{CP}(\text{change}), \quad\text{(Equation 6)}$$

where $I_{CP}$(initial) is the initial charge pump current set for the center frequency. As a result, the LO-GEN 74 is able to easily maintain a constant, fixed bandwidth at any frequency across the loop bandwidth.

Figure 3B:
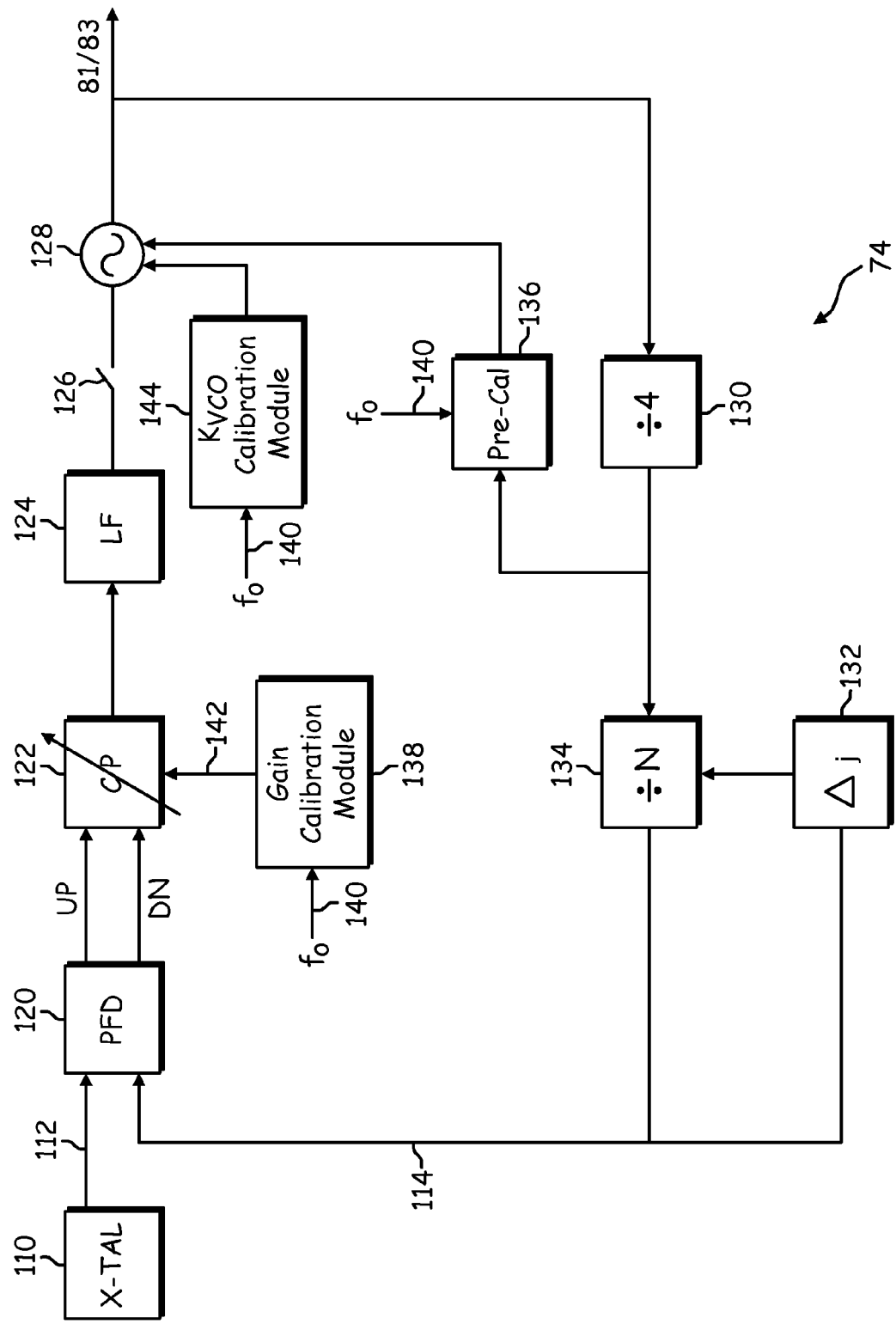

FIG. 3B is a schematic block diagram of another exemplary local oscillation module 74 (LO-GEN), in accordance with embodiments of the present invention. As in FIG. 3A, the LO-GEN 74 includes the precise crystal oscillator (X-TAL) 110, the phase and frequency detector (PFD) 120, the charge pump (CP) 122, the lowpass loop filter (LPF) 124, the voltage controlled oscillator (VCO) 128 and the frequency divider in the feedback path, represented by blocks 130, 132 and 134. In addition, the LO-GEN also includes the switch 126, the pre-calibration module 136 and the gain calibration module 138.

In some embodiments, when adjusting the charge pump current, the VCO gain ($k_{VCO}$) may vary widely, e.g., by as much as 20%, which can significantly affect the noise and performance of the LO-GEN. Therefore, in accordance with embodiments of the present invention, the VCO gain ($k_{VCO}$) can initially be coarsely set prior to adjusting the charge pump current. To program the VCO gain ($k_{VCO}$), the LO-GEN 74 further includes a $k_{VCO}$ calibration module 144.

The $k_{VCO}$ calibration module 144 operates to program the VCO gain to one of several different coarse settings based on the desired oscillation frequency. For example, each of the potential VCO gains over the range of frequencies covered by the VCO 128 can be divided into two or more regions and a particular VCO gain (i.e., a center VCO gain, a beginning or end VCO gain or any other VCO gain) within each VCO region is selected as a coarse VCO gain representative of each VCO region. In an exemplary embodiment, the potential VCO gains may be divided into eight (8) regions and the center VCO gain in each region may be selected as the representative coarse VCO gain for that region.

Based on the desired oscillation frequency $f_0$, the $k_{VCO}$ calibration module 144 determines the expected VCO gain ($k_{VCO}$) using Equation 1 above (i.e., $k_{VCO} \cong f^3$). The $k_{VCO}$ calibration module 144 then determines the region that the expected VCO gain falls within and selects the representative coarse VCO gain for that region to program the VCO 128. For example, the $k_{VCO}$ calibration module 144 can include a 3-bit binary weighted array of varactors coupled to the VCO LC tank. One of the eight (8) coarse regions can be selected by programming the 3-bit array of varactors to one of the representative coarse VCO gain setting. After the initial coarse VCO gain programming, the VCO gain should be within +/−5%. The remaining error in the VCO gain can then be corrected by electing the right $I_{CP}$, as described above.

In an exemplary operation, during the open loop calibration, the switch 126 remains in the "OFF" or open state, thus preventing the output from the LF 124 from controlling the VCO 128. Instead, the pre-calibration module 136 controls the VCO 128 and enables the VCO 128 output to "lock" to the desired new oscillation frequency ($f_0$) 140. At the same time, the $k_{VCO}$ calibration module 144 generates a control signal based on the desired new oscillation frequency (f$_o$) 140 that operates to adjust the gain of the VCO 128 to one of two or more coarse VCO gain settings. After the initial coarse VCO gain programming, the gain calibration module 138 generates a control signal 142 based on the desired new oscillation frequency (f$_o$) 140 that operates to adjust the charge pump current (I$_{CP}$) inversely proportional to the square of the desired new oscillation frequency (f$_o$) 140, as described above. Once the pre-calibration module 138 locks the VCO 128 onto the desired new oscillation frequency and the gain calibration module 138 programs the charge pump (CP) to compensate for variations in the VCO gain resulting from the change to the new oscillation frequency, the switch 126 closes to enable the control voltage output from the LP 124 to once again control the VCO 128.

Figure 4:
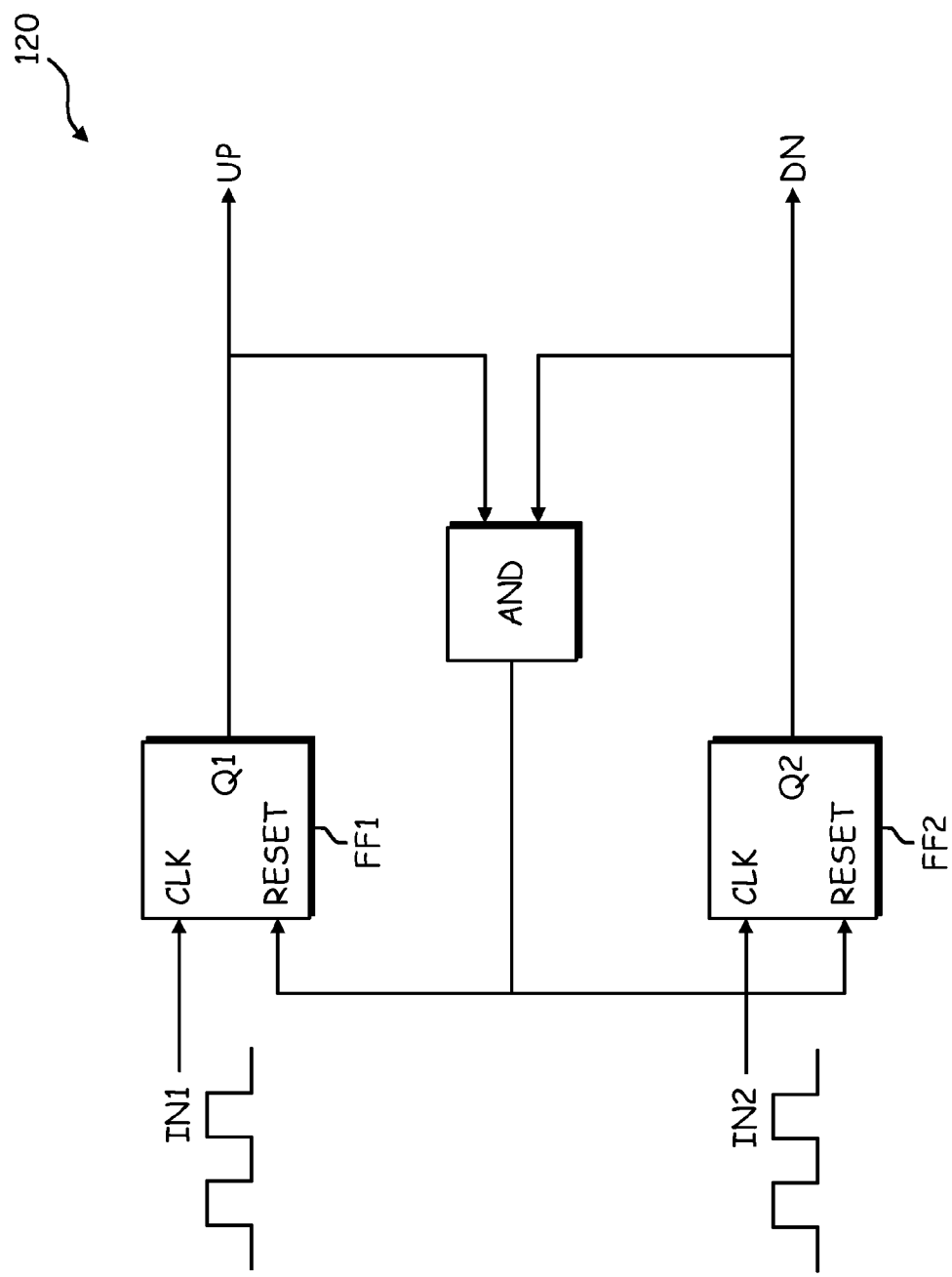
FIG. 4 is a schematic block diagram illustrating an exemplary phase and frequency detector (PFD) for use in embodiments of the present invention.

FIG. 4 shows details of an exemplary implementation of the PFD 120. Two reset-able flip-flops FF1 and FF2 are coupled with an AND gate in a feedback loop. Assuming that the signals IN1 and IN2 are appropriate for driving digital circuitry, the operation of the PFD 124 is as follows. After reset, the outputs UP and DN are LOW, or 0. If IN1 goes HIGH, or 1, then UP goes HIGH. When IN2 goes HIGH, DN goes HIGH momentarily, resulting in a positive edge at the AND gate output. This edge resets the two flip-flops FF1 and FF2 to the initial state (UP,DN)=(0,0). Thus, any phase difference between the two signals IN1 and IN2 results in the PFD 120 residing in the state (UP,DN)=(1,0) for a duration of time proportional to the phase difference between IN1 and IN2. Similarly, any difference in frequency between IN1 and IN2 results in the PFD 120 residing in either the state (UP, DN)=(1,0) or the state (UP,DN)=(0,1), depending upon the sign of the frequency difference.

Figure 5:
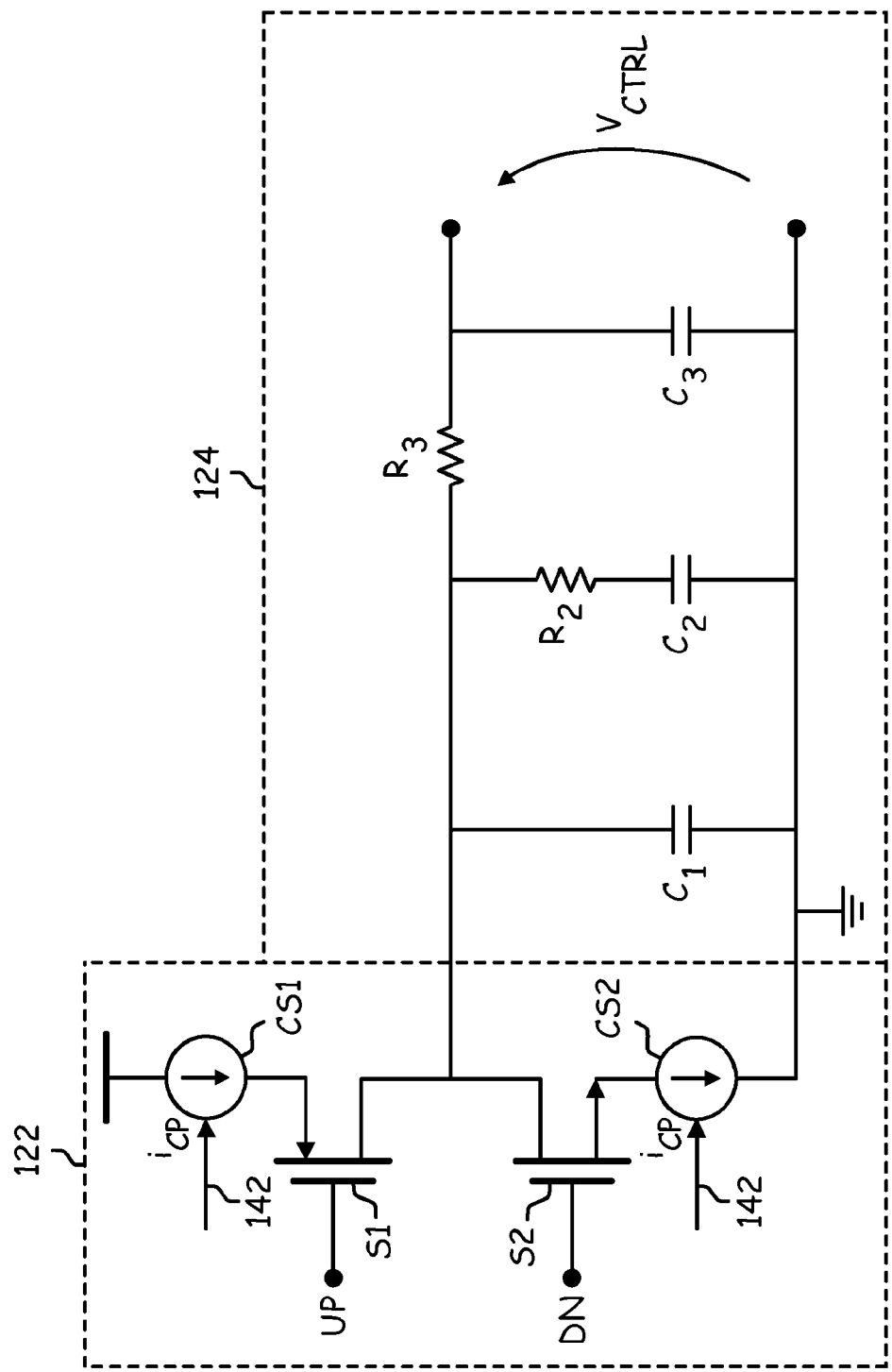
FIG. 5 is a circuit schematic illustrating an exemplary charge pump and loop filter combination for use in embodiments of the present invention.

FIG. 5 shows details of an exemplary implementation of the charge pump 122 and loop filter 124 combination. The charge pump 122 responds to the (UP,DN) control signals of the PFD by either "pumping" current into the loop filter 124 or moving current out of the loop filter 124 and "pumping" it into ground. The charge pump 122 includes two equally weighted programmable current sources CS1 and CS2, each with a nominal output current I$_{CP}$, in an arrangement with two switches S1 and S2 controlled by UP and DN. The value of each current source CS1 and CS2 is programmed by the control signal 142 generated by the gain calibration module, as described above in connection with FIG. 3.

Thus, it follows that the CP 122 essentially functions as an asynchronously clocked digital-to-analog converter (DAC) whose nominal output y$_{CP}$(t) depends upon the digital inputs UP and DN such that $$y_{CP}(t) = \begin{cases} I_{CP}, & \text{if } \{UP, DN\} = \{1,0\} \\ 0, & \text{if } \{UP, DN\} = \{1,1\} \\ 0, & \text{if } \{UP, DN\} = \{0,0\} \\ -I_{CP}, & \text{if } \{UP, DN\} = \{0,1\} \end{cases}$$

The current pulses of the CP 122 are filtered by the loop filter 124 thereby generating a smooth output voltage referred to as the "control voltage", v$_{ctrl}$. The loop filter 124 typically consists of passive components, e.g., resistors R2 and R3 and capacitors C1, C2 and C3. The loop filter 124 shown in FIG. 5 is a third-order loop filter because it contains three poles.

Figure 6:
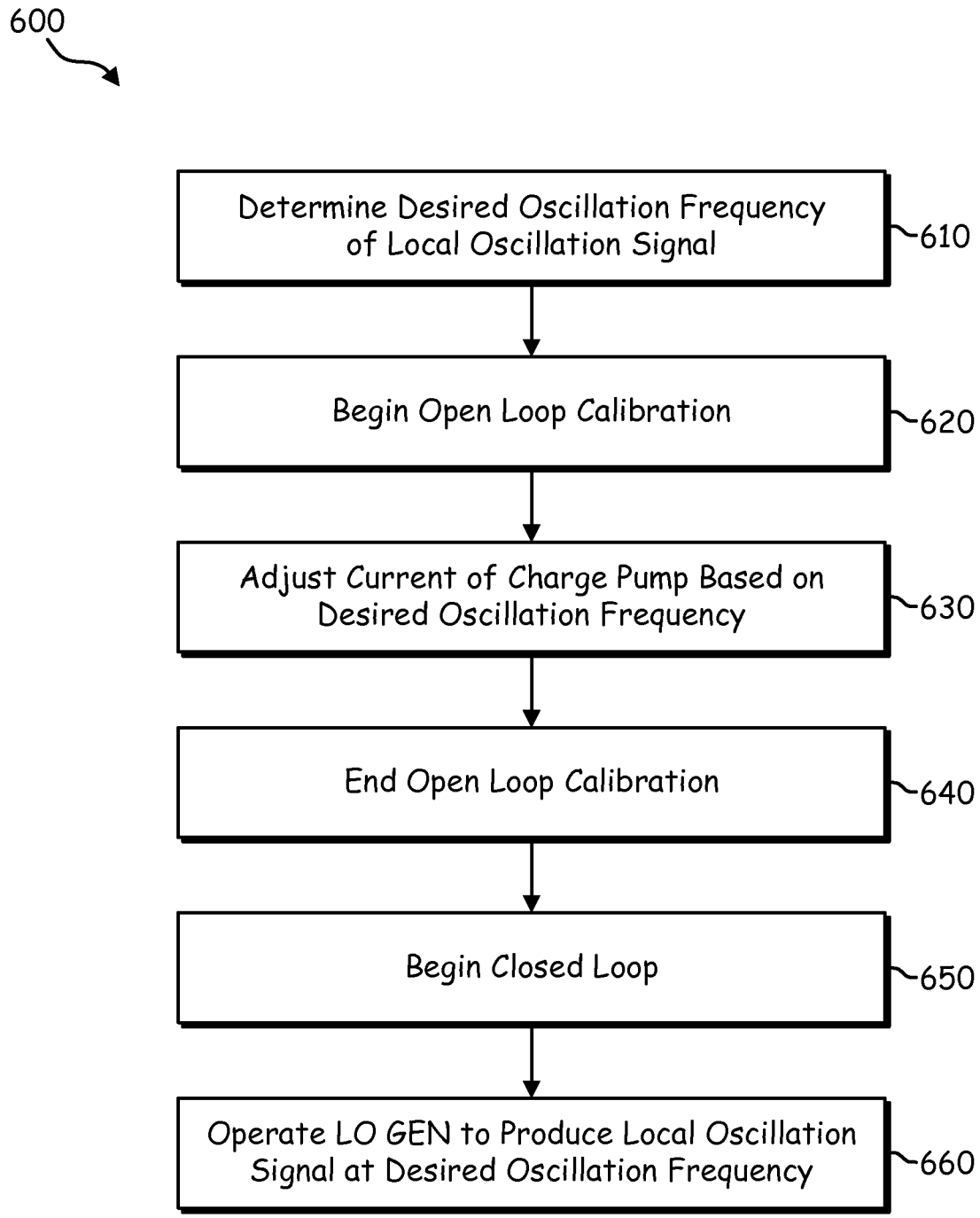
FIG. 6 is a flowchart illustrating one method of the present invention.

FIG. 6 is a flowchart illustrating an exemplary method 600 of the present invention for operating a fixed bandwidth LO-GEN to produce a local oscillation signal at a desired oscillation frequency. Initially, at block 610, the desired frequency of oscillation of the VCO is determined, and at block 620, open loop calibration of the LO-GEN begins. During open loop calibration, at block 630, the charge pump current is adjusted based on the desired frequency of oscillation in order to maintain a constant, fixed bandwidth of the LO-GEN. After the open loop calibration is completed at block 640, the LO-GEN enters a closed loop mode at block 650, and at block 660, operates to produce a local oscillation signal at the desired oscillation frequency, while maintaining a constant bandwidth.

Figure 7:
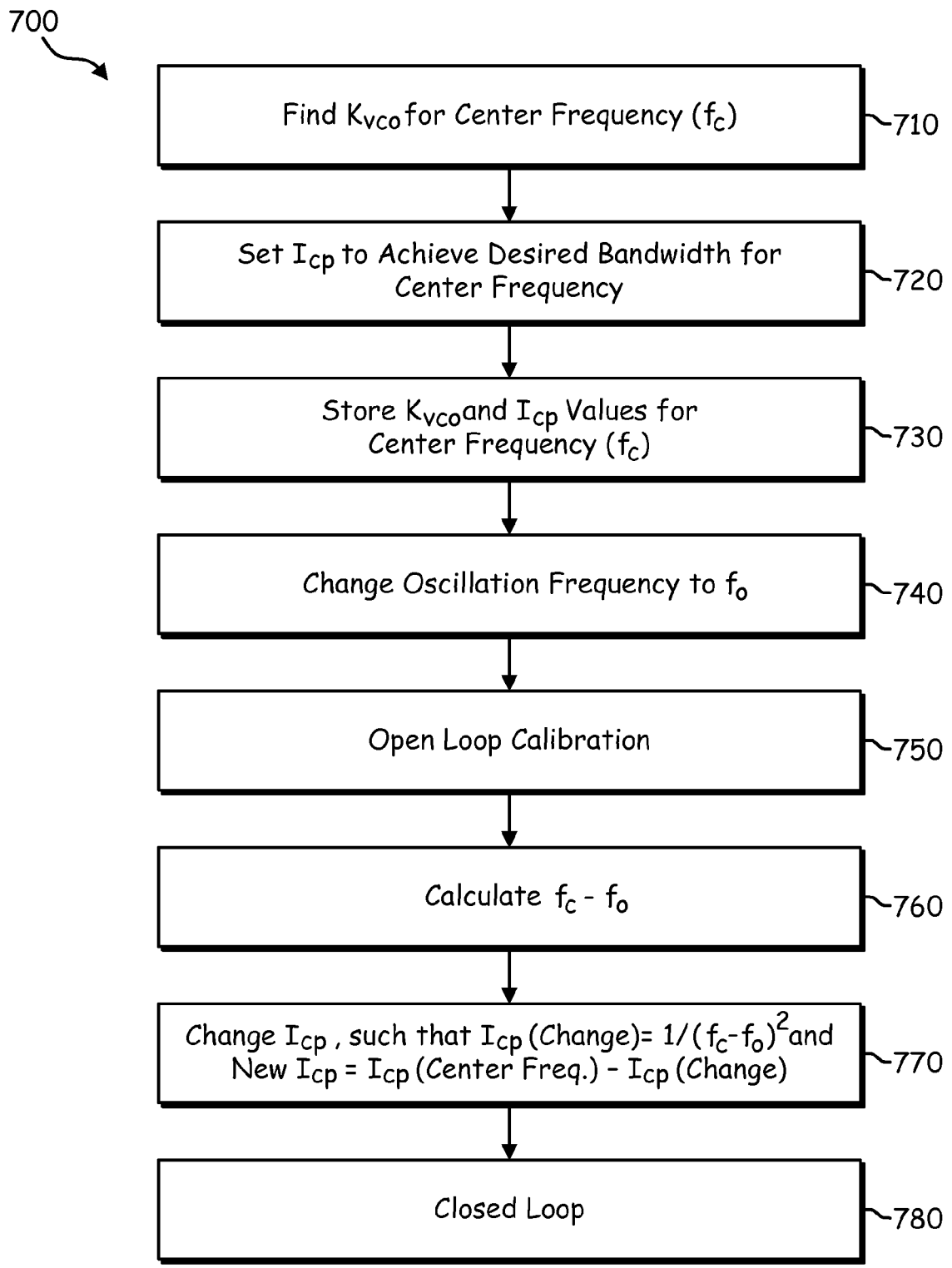
FIG. 7 is a flowchart illustrating a more detailed method of the present invention.

FIG. 7 is a flowchart illustrating a more detailed method 700 of the present invention for operating a fixed bandwidth LO-GEN to produce a local oscillation signal at a desired oscillation frequency. Initially, at block 710, the initial VCO gain (k$_{VCO}$) for the center frequency (f$_c$) across a bandwidth of interest (e.g., the desired bandwidth of the LO-GEN) is determined. Based on the VCO gain for the center frequency, and using Equation 2 above, at block 720, the charge pump current (I$_{CP}$) is set to an initial value such that the resulting loop bandwidth of the LO-GEN is equal to the desired bandwidth (BW) of the LO-GEN. Once these initial values have been determined, at block 730, the gain calibration module 138 stores the initial k$_{VCO}$ and the initial I$_{CP}$ for the center frequency. At block 740, when the oscillation frequency of the VCO changes to a new oscillation frequency f$_o$, at block 750, an open loop calibration is performed on the LO-GEN to 138 locks the VCO onto the desired new oscillation frequency and to compensate for variations in the VCO gain resulting from the change to the new oscillation frequency In particular, at block 760, the difference between the center frequency f$_c$ and the new oscillation frequency f$_o$ is calculated. In addition, at block 770, the adjustment in charge pump current, denoted I$_{CP}$(change), is calculated as the inverse of the square of this difference, and the new charge pump current is set as the difference between the initial charge pump current at the center frequency, denoted I$_{CP}$ (center frequency), and I$_{CP}$(change). Thereafter, at block 780, the LO-GEN enters a closed loop mode, where the VCO output is locked onto the desired new oscillation frequency f$_o$.

Figure 8:
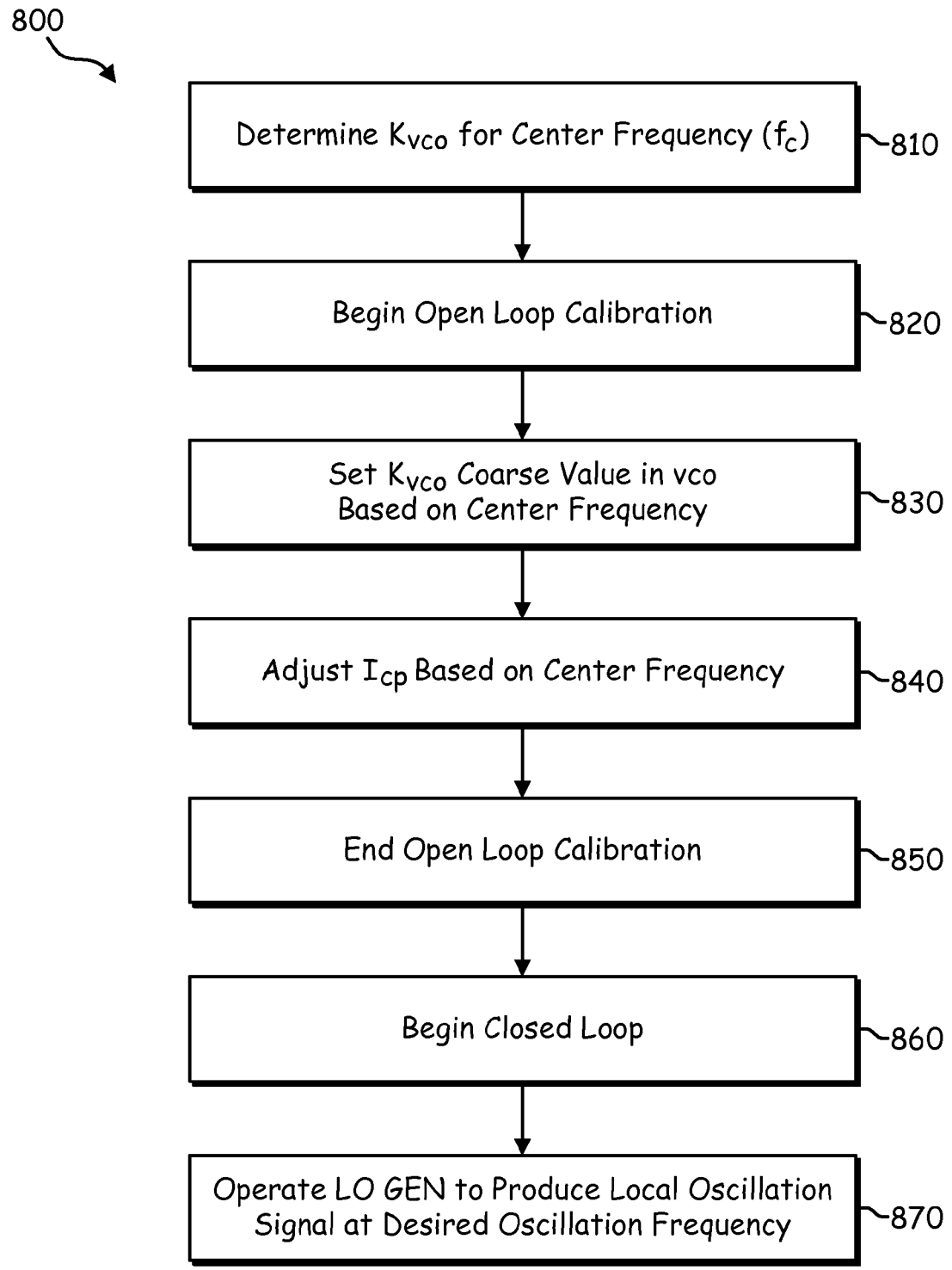
FIG. 8 is a flowchart illustrating another method of the present invention.

FIG. 8 is a flowchart illustrating another exemplary method 800 of the present invention for operating a fixed bandwidth LO-GEN to produce a local oscillation signal at a desired oscillation frequency (f$_c$). Initially, at block 810, the desired frequency of oscillation of the VCO is determined, and at block 820, open loop calibration of the LO-GEN begins. During open loop calibration, at block 630, the VCO gain is programmed to an initial coarse value based on the desired oscillation center frequency.

Thereafter, at block 640, the charge pump current is adjusted based on the desired frequency of oscillation in order to maintain a constant, fixed bandwidth of the LO-GEN. After the open loop calibration is completed at block 850, the LO-GEN enters a closed loop mode at block 860, and at block 870, operates to produce a local oscillation signal at the desired oscillation frequency, while maintaining a constant bandwidth.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A local oscillation generator for use in a transceiver, comprising:
    a phase locked loop operable to produce a radio frequency (RF) local oscillation signal, wherein the phase locked loop includes:
        a phase and frequency detector connected to receive a reference signal and a feedback signal and operable to produce an error signal indicative of a difference in phase or frequency between the reference signal and the feedback signal,
        a programmable charge pump coupled to receive the error signal and operable to generate a current pulse proportional to the error signal,
        a loop filter coupled to receive the current pulse and operable to filter the current pulse to produce a control voltage,
        a voltage controlled oscillator (VCO) coupled to receive the control voltage and operable to produce the RF local oscillation signal based on the control voltage, and
        a frequency divider coupled to receive the RF local oscillation signal and divide the RF local oscillation signal by a divide ratio to produce the feedback signal;
    a pre-calibration module operable to enable the RF local oscillation signal output by the VCO to lock on-to a desired new oscillation frequency;
    a VCO calibration module operable to program a gain of the VCO to an initial coarse VCO gain value based on the desired new oscillation frequency while the VCO locks-on to the desired new oscillation frequency, the initial coarse VCO gain value being selected from a plurality of predetermined coarse VCO gain values, each of the plurality of predetermined coarse VCO gain values representing one of a plurality of gain regions, each including a respective range of VCO gain values; and
    a gain calibration module operable to adjust the current pulse produced by the programmable charge pump to compensate for changes in the gain of the voltage controlled oscillator.

2. The local oscillation generator of claim 1, wherein the pre-calibration module, the VCO calibration module and the gain calibration module each operate during an open loop calibration of the phase locked loop and the gain calibration module operates to adjust the current pulse after the VCO gain calibration module programs the gain of the VCO to the initial coarse VCO gain value.

3. The local oscillation generator of claim 2, wherein:
    the pre-calibration module, the VCO calibration module and the gain calibration module are each coupled to receive as input a desired new oscillation frequency of the voltage controlled oscillator;
    the VCO calibration module is operable to program the gain of the VCO to the initial coarse VCO gain value as a cubic function of the desired new oscillation frequency; and
    the gain calibration module is operable to adjust the programmable charge pump based on the desired new oscillation frequency.

4. The local oscillation generator of claim 3, wherein the VCO calibration module selects the initial coarse VCO gain value as a select one of the plurality of predetermined coarse VCO gain values corresponding to the gain region having a VCO gain value associated with the desired new oscillation frequency.

5. The local oscillation generator of claim 4, wherein the plurality of predetermined coarse VCO gain values are each one of a beginning VCO gain value for the respective VCO gain region, an ending VCO gain value for the respective VCO gain region or a middle VCO gain value for the respective VCO gain region.

6. The local oscillation generator of claim 3, wherein the gain calibration module is operable to adjust the current pulse of the programmable charge pump inversely proportional to the square of the change in frequency between an initial oscillation frequency and the desired new oscillation frequency.

7. The local oscillation generator of claim 3, wherein the gain calibration module is operable to determine an initial gain of the voltage controlled oscillator for a center oscillation frequency across a fixed bandwidth of interest and to adjust the current pulse of the programmable charge pump to an initial current to enable the phase-locked loop to maintain the fixed bandwidth of interest for the center oscillation frequency.

8. The local oscillation generator of claim 7, wherein the gain calibration module is further operable to calculate the difference between the center oscillation frequency and the desired new oscillation frequency and to calculate a current change as the inverse of the square of the difference between the center oscillation frequency and the desired new oscillation frequency.

9. The local oscillation generator of claim 8, wherein the gain calibration module is further operable to adjust the programmable charge pump such that a new current produced by the programmable charge pump is equal to the difference between the initial current and the current change in order to maintain the fixed bandwidth of interest.

10. The local oscillation generator of claim 9, wherein the gain calibration module is operable to adjust the programmable charge pump to the respective new current each time the desired oscillation frequency of the voltage controlled oscillator changes.

11. The local oscillation generator of claim 1, wherein the VCO calibration module includes a 3-bit binary weighted array of varactors coupled to an LC tank of the VCO.

12. A transceiver for use in a wireless device, comprising:
    a receiver coupled to receive an inbound radio frequency (RF) signal and operable convert the inbound RF signal to a low frequency signal using an RF local oscillation signal;

a transmitter coupled to receive an outbound low frequency signal and operable to convert the outbound low frequency signal to an outbound RF signal using the RF local oscillation signal; and a local oscillation generator operable to produce a radio frequency (RF) local oscillation signal, wherein the local oscillation generator includes:

a phase and frequency detector connected to receive a reference signal and a feedback signal and operable to produce an error signal indicative of a difference in phase or frequency between the reference signal and the feedback signal, a programmable charge pump coupled to receive the error signal and operable to generate a current pulse proportional to the error signal, a loop filter coupled to receive the current pulse and operable to filter the current pulse to produce a control voltage, a voltage controlled oscillator (VCO) coupled to receive the control voltage and operable to produce the RF local oscillation signal based on the control voltage a frequency divider coupled to receive the RF local oscillation signal and divide the RF local oscillation signal by a divide ratio to produce the feedback signal, a pre-calibration module operable to enable the RF local oscillation signal output by the VCO to lock-on to a desired new oscillation frequency;

a VCO calibration module operable to program a gain of the VCO to an initial coarse VCO gain value based on the desired new oscillation frequency while the VCO locks-on to the desired new oscillation frequency, the initial coarse VCO gain value being selected from a plurality of predetermined coarse VCO gain values, each of the plurality of predetermined coarse VCO gain values representing one of a plurality of gain regions, each including a respective range of VCO gain values, and a gain calibration module operable to adjust the current pulse produced by the programmable charge pump to compensate for changes in the gain of the voltage controlled oscillator.

13. The transceiver of claim 12, wherein the pre-calibration module, the VCO calibration module and the gain calibration module each operate during an open loop calibration of the phase locked loop and the gain calibration module operates to adjust the current pulse after the VCO gain calibration module programs the gain of the VCO to the initial coarse VCO gain value.

14. The transceiver of claim 13, wherein:
the pre-calibration module, the VCO calibration module and the gain calibration module are each coupled to receive as input a desired new oscillation frequency of the voltage controlled oscillator;
the VCO calibration module is operable to program the gain of the VCO to the initial coarse VCO gain value as a cubic function of the desired new oscillation frequency; and
the gain calibration module is operable to adjust the programmable charge pump based on the desired new oscillation frequency.

15. The transceiver of claim 14, wherein the VCO calibration module selects the initial coarse VCO gain value as a select one of the plurality of predetermined coarse VCO gain values corresponding to the gain region having a VCO gain value associated with the desired new oscillation frequency.

16. The transceiver of claim 14, wherein the gain calibration module is operable to determine an initial gain of the voltage controlled oscillator for a center oscillation frequency across a fixed bandwidth of interest and to adjust the current pulse of the programmable charge pump to an initial current to enable the phase-locked loop to maintain the fixed bandwidth of interest for the center oscillation frequency.

17. The transceiver of claim 16, wherein the gain calibration module is further operable to calculate the difference between the center oscillation frequency and the desired new oscillation frequency, to calculate a current change as the inverse of the square of the difference between the center oscillation frequency and the desired new oscillation frequency and to adjust the programmable charge pump such that a new current produced by the programmable charge pump is equal to the difference between the initial current and the current change in order to maintain the fixed bandwidth of interest.

18. A method for producing a radio frequency (RF) local oscillation signal for use in a transceiver using a phase-locked loop, comprising:
determining a desired new oscillation frequency of the RF local oscillation signal;
within an open loop mode, calibrating the phase-locked loop for the oscillation frequency, wherein the calibrating includes:
enabling the RF local oscillation signal to lock-on to the desired new oscillation frequency;
programming a gain of a voltage controlled oscillator (VCO) to an initial coarse VCO gain value based on the desired new oscillation frequency of the RF local oscillation signal while the VCO locks-on to the desired new oscillation frequency, the initial coarse VCO gain value being selected from a plurality of predetermined coarse VCO gain values, each of the plurality of predetermined coarse VCO gain values representing one of a plurality of gain regions, each including a respective range of VCO gain values, and
adjusting a current produced by a programmable charge pump within the phase-locked loop based on the desired new oscillation frequency to maintain a fixed bandwidth of the phase-locked loop; and
within a closed loop mode, operating the phase-locked loop to produce the RF local oscillation signal at the desired new oscillation frequency.

19. The method of claim 18, wherein the step of calibrating further comprises:
programming the gain of the VCO to the initial coarse VCO gain value as a cubic function of the desired new oscillation frequency;
adjusting the current pulse inversely proportional to the square of the change in frequency between an initial oscillation frequency and the desired new oscillation frequency.

20. The method of claim 19, wherein the step of programming the gain of the VCO further comprises:
selecting the initial coarse VCO gain value as a select one of the plurality of predetermined coarse VCO gain values corresponding to the gain region having a VCO gain value associated with the desired new oscillation frequency.

21. The method of claim 19, wherein the step of adjusting the current pulse further comprises:
determining an initial gain of the phase-locked loop for a center oscillation frequency across a fixed bandwidth of interest; and
adjusting the current pulse to an initial current to enable the phase-locked loop to maintain the fixed bandwidth of interest for the center oscillation frequency;

calculating the difference between the center oscillation frequency and the desired new oscillation frequency;

calculating a current change as the inverse of the square of the difference between the center oscillation frequency and the desired new oscillation frequency; and adjusting the programmable charge pump such that a new current produced by the programmable charge pump is equal to the difference between the initial current and the current change in order to maintain the fixed bandwidth of interest.

* * * * *

UNITED STATES PATENT AND TRADEMARK OFFICE
CERTIFICATE OF CORRECTION

PATENT NO.         : 8,674,771 B2
APPLICATION NO.    : 12/765754
DATED              : March 18, 2014
INVENTOR(S)        : Hooman Darabi Page 1 of 1

It is certified that error appears in the above-identified patent and that said Letters Patent is hereby corrected as shown below:

In the Claims

Col. 12, line 65, in claim 12: after "(RF) signal and operable" insert --to--
Col. 13, line 21, in claim 12: after "based on the control voltage" insert --,--

Signed and Sealed this
Twenty-fifth Day of November, 2014

Michelle K. Lee
*Deputy Director of the United States Patent and Trademark Office*